(12) United States Patent
Wu

(10) Patent No.: US 12,262,524 B2
(45) Date of Patent: Mar. 25, 2025

(54) METHOD OF MANUFACTURING MEMORY DEVICE HAVING WORD LINES WITH IMPROVED RESISTANCE

(71) Applicant: NANYA TECHNOLOGY CORPORATION, New Taipei (TW)

(72) Inventor: Jung-Yu Wu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 423 days.

(21) Appl. No.: 17/555,758

(22) Filed: Dec. 20, 2021

(65) Prior Publication Data

US 2023/0200046 A1 Jun. 22, 2023

(51) Int. Cl.
H10B 12/00 (2023.01)

(52) U.S. Cl.
CPC .......... *H10B 12/09* (2023.02); *H10B 12/053* (2023.02); *H10B 12/34* (2023.02); *H10B 12/50* (2023.02)

(58) Field of Classification Search
CPC ...... H10B 12/09; H10B 12/053; H10B 12/34; H10B 12/50; H10B 12/488
See application file for complete search history.

(56) References Cited

U.S. PATENT DOCUMENTS

| 2011/0180868 A1* | 7/2011 | Jang | H10B 12/053 257/330 |
| 2015/0287634 A1* | 10/2015 | Agarwal | H01L 21/32136 438/720 |
| 2017/0069632 A1* | 3/2017 | Wu | H10B 12/053 |
| 2018/0254277 A1* | 9/2018 | Chen | H10B 12/02 |
| 2021/0242211 A1* | 8/2021 | Huang | H01L 21/76802 |
| 2021/0398985 A1* | 12/2021 | Chang | H10B 12/50 |
| 2023/0197771 A1* | 6/2023 | Hsiao | H01L 23/53257 257/296 |
| 2023/0200044 A1* | 6/2023 | Hsiao | H10B 12/488 438/589 |

FOREIGN PATENT DOCUMENTS

| TW | I458050 B | 10/2014 |
| TW | I725767 B | 4/2021 |
| TW | I746332 B | 11/2021 |

OTHER PUBLICATIONS

Office Action mailed on Oct. 25, 2022 related to Taiwanese Application No. 111109656.
Office Action mailed on Oct. 10, 2023 related to U.S. Appl. No. 17/557,991.

* cited by examiner

*Primary Examiner* — Ali Naraghi
*Assistant Examiner* — Scott E Bauman
(74) *Attorney, Agent, or Firm* — Xuan Zhang

(57) ABSTRACT

The present application provides a method for manufacturing a memory device having word lines with improved resistance, and a manufacturing method of the memory device. The method includes providing a semiconductor substrate defined with a peripheral region and an array region at least partially surrounded by the peripheral region; forming a first recess extending into the semiconductor substrate and disposed in the array region; and forming a word line disposed within the first recess. The formation of the word line includes disposing an insulating layer conformal to the first recess, and forming a conductive member surrounded by the insulating layer and having a second recess extending into the conductive member and toward the semiconductor substrate.

20 Claims, 20 Drawing Sheets

METHOD OF MANUFACTURING MEMORY DEVICE HAVING WORD LINES WITH IMPROVED RESISTANCE

TECHNICAL FIELD

The present disclosure relates to a memory device and a manufacturing method thereof, and more particularly, to a memory device having several word lines (WL) with improved resistance and a manufacturing method of the memory device.

DISCUSSION OF THE BACKGROUND

A dynamic random-access memory (DRAM) is a type of semiconductor arrangement for storing bits of data in separate capacitors within an integrated circuit (IC). DRAMs commonly take the form of trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As the size of a cell transistor is reduced to a few nanometers in length, an internal resistance of components in the cell transistor may become critical. A high internal resistance may result in a significant drop in performance of the cell transistors. It is therefore desirable to develop improvements that address related manufacturing challenges.

SUMMARY

One aspect of the present disclosure provides a memory device. The memory device includes a semiconductor substrate defined with a peripheral region and an array region at least partially surrounded by the peripheral region, wherein a first recess extending into the semiconductor substrate is disposed in the array region, an isolation structure surrounded by the semiconductor substrate is disposed in the peripheral region, and a word line is disposed within the first recess, wherein the word line includes an insulating layer conformal to the first recess and a conductive member surrounded by the insulating layer, and the conductive member includes a second recess extending into the conductive member and toward the semiconductor substrate.

In some embodiments, the conductive member includes titanium nitride (TiN).

In some embodiments, a first width of the first recess is substantially greater than a second width of the second recess.

In some embodiments, the insulating layer surrounds the second recess.

In some embodiments, a top surface of the conductive member is disposed above a top surface of the insulating layer.

In some embodiments, the isolation structure and the insulating layer include oxide.

In some embodiments, the memory device further comprises a dielectric layer over the semiconductor substrate, the isolation structure and the insulating layer.

In some embodiments, the dielectric layer includes nitride.

In some embodiments, a top surface of the insulating layer is covered by the dielectric layer.

In some embodiments, a top surface of the conductive member is exposed through the dielectric layer.

In some embodiments, the memory device further comprises a work function member filling at least a portion of the second recess.

In some embodiments, the work function member includes polysilicon.

Another aspect of the present disclosure provides a memory device. The memory device includes a semiconductor substrate defined with a peripheral region and an array region at least partially surrounded by the peripheral region; an isolation structure surrounded by the semiconductor substrate and disposed in the peripheral region; and a word line surrounded by the semiconductor substrate and disposed in the array region, wherein the word line includes an insulating layer and a conductive member surrounded by the insulating layer, the conductive member includes a lining portion conformal to the insulating layer and further includes a plug portion extending from the lining portion toward the semiconductor substrate, and the lining portion and the plug portion are integrally formed.

In some embodiments, the lining portion and the plug portion include a same material.

In some embodiments, the lining portion and the plug portion include titanium nitride (TiN).

In some embodiments, the lining portion is disposed above the plug portion.

In some embodiments, the plug portion is entirely surrounded by the insulating layer.

In some embodiments, the plug portion is tapered from the lining portion toward the semiconductor substrate.

In some embodiments, the lining portion at least partially protrudes from the semiconductor substrate and the insulating layer.

In some embodiments, the memory device further comprises a dielectric layer over the semiconductor substrate, the isolation structure and the insulating layer.

In some embodiments, the dielectric layer includes nitride.

In some embodiments, the dielectric layer is separated from the plug portion.

In some embodiments, the dielectric layer is in contact with the lining portion.

In some embodiments, the semiconductor substrate includes silicon.

Another aspect of the present disclosure provides a method of manufacturing a memory device. The method includes steps of providing a semiconductor substrate defined with a peripheral region and an array region at least partially surrounded by the peripheral region; forming a first recess extending into the semiconductor substrate and disposed in the array region; and forming a word line disposed within the first recess, wherein the formation of the word line includes disposing an insulating layer conformal to the first recess, and forming a conductive member surrounded by the insulating layer and having a second recess extending into the conductive member and toward the semiconductor substrate.

In some embodiments, the formation of the conductive member includes disposing a conductive material covering the insulating layer and the semiconductor substrate, and removing the conductive material disposed over the semiconductor substrate and surrounded by the insulating layer to form the conductive member.

In some embodiments, the removal of the conductive material includes removing a first portion of the conductive material disposed over the semiconductor substrate, and removing a second portion of the conductive material surrounded by the insulating layer.

In some embodiments, the removal of the first portion of the conductive material is performed immediately prior to the removal of the second portion of the conductive material.

In some embodiments, the second recess is formed by the removal of the second portion of the conductive material.

In some embodiments, the method further comprises disposing a dielectric material over the semiconductor substrate and the insulating layer, wherein the conductive material is disposed on the dielectric material and the insulating layer.

In some embodiments, the dielectric material is disposed after the disposing of the insulating layer.

In some embodiments, during the removal of the first portion and the second portion of the conductive material, the method further comprises heating the semiconductor substrate to a predetermined temperature, and applying a step pulsing function for the removal of the first portion and the second portion of the conductive material in a predetermined duty cycle.

In some embodiments, the predetermined temperature is in a range of about 95° C. to about 140° C.

In some embodiments, the predetermined temperature is substantially greater than 120° C.

In some embodiments, the predetermined duty cycle is in a range of about 15% to about 25%.

In conclusion, because titanium nitride (TiN), instead of tungsten (W), is used for a conductive member of the word line of the memory device, an electrical resistance of the word line using titanium nitride (TiN) is reduced. Further, since the conductive member is formed by disposing titanium nitride (TiN) over the semiconductor substrate and within a recess of the word line and etching back a portion of titanium nitride (TiN) inside the recess, planarization of a portion of titanium nitride (TiN) disposed over the semiconductor substrate and cleaning after the planarization can be omitted. Therefore, performance of the memory device and process of manufacturing of the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
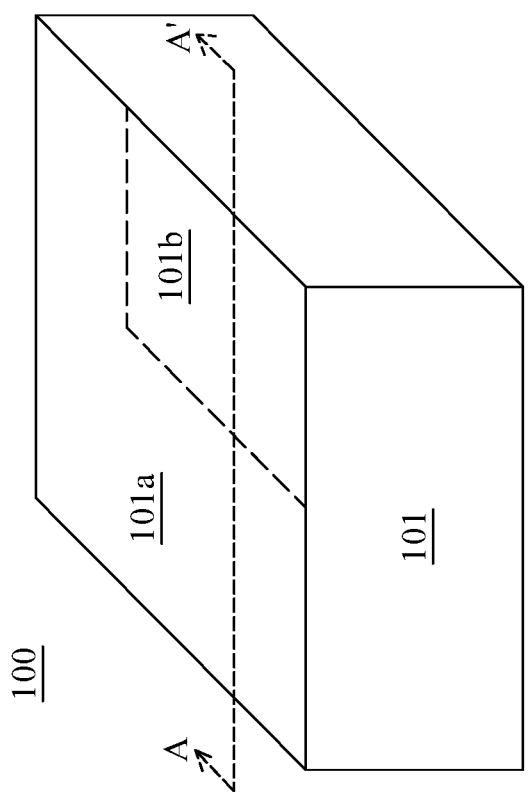
FIG. 1 is a perspective view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
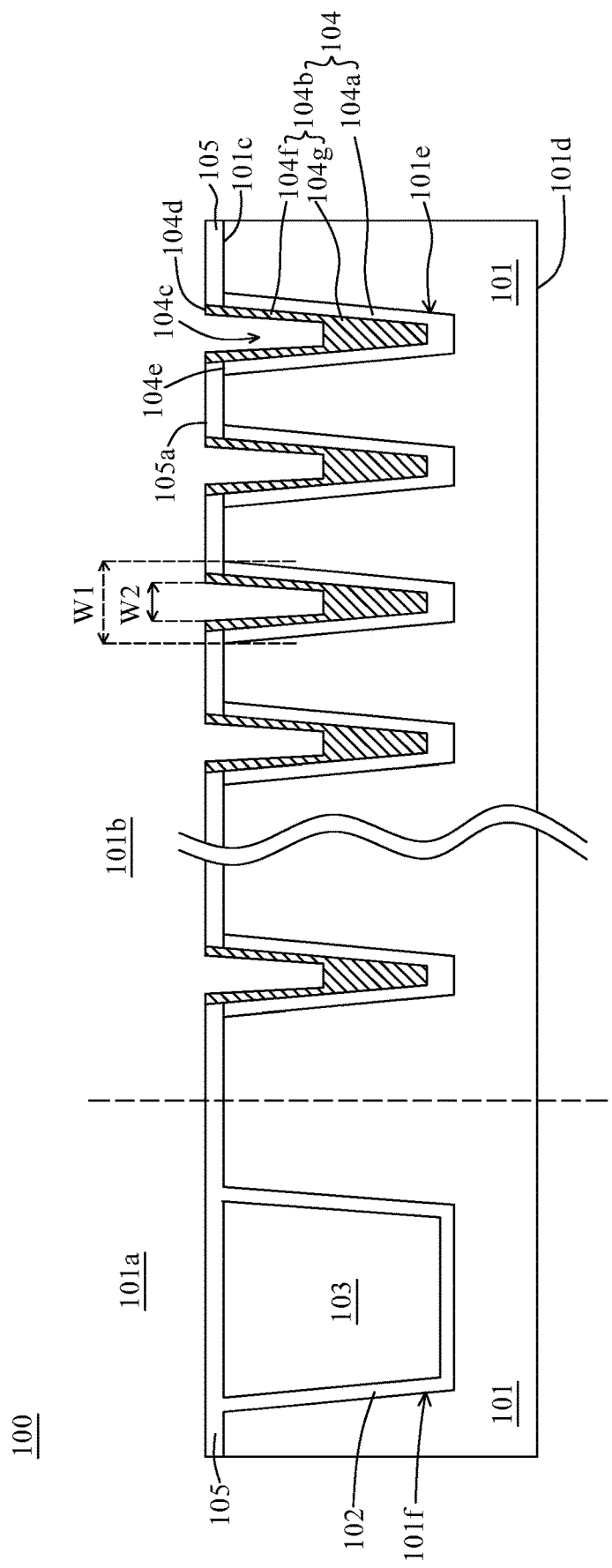
FIG. 2 is an embodiment of a cross-sectional side view of the memory device along a line A-A' in FIG. 1.

FIG. 1 is a schematic perspective view of a memory device 100 in accordance with some embodiments of the present disclosure. FIG. 2 is a schematic cross-sectional view of the memory device 100 along a line A-A' in FIG. 1. In some embodiments, the memory device 100 includes several unit cells arranged along rows and columns.

In some embodiments, the memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes several active areas (AA). The active area is a doped region in the semiconductor substrate 101. In some embodiments, the active area extends horizontally over or under a top surface of the semiconductor substrate 101. In some embodiments, each of the active areas includes a same type of dopant. In some embodiments, each of the active areas includes a type of dopant that is different from the types of dopants included in other active areas. In some embodiments, each of the active areas has a same conductive type. In some embodiments, the active area includes N-type dopants.

In some embodiments, the semiconductor substrate 101 defines a peripheral region 101a and an array area 101b at least partially surrounded by the peripheral region 101a. In some embodiments, the peripheral region 101a is adjacent to a periphery of the semiconductor substrate 101, and the array area 101b is adjacent to a central area of the semiconductor substrate 101. In some embodiments, the array area 101b may be used for fabricating transistors.

In some embodiments, the semiconductor substrate 101 includes a first surface 101c and a second surface 101d opposite to the first surface 101c. In some embodiments, the first surface 101c is a front side of the semiconductor substrate 101, wherein electrical devices or components are subsequently formed over the first surface 101c and configured to electrically connect to an external circuitry. In some embodiments, the second surface 101d is a back side of the substrate 101, where electrical devices or components are absent.

In some embodiments, the semiconductor substrate 101 includes a first recess 101e extending into the semiconductor substrate 101 and disposed in the array region 101b. In some embodiments, the first recess 101e extends from the first surface 101c toward the second surface 101d of the semiconductor substrate 101. In some embodiments, the first recess 101e is tapered from the first surface 101c toward the second surface 101d of the semiconductor substrate 101. As shown in FIG. 2, several first recesses 101e are formed in the array region 101b. The first recesses 101e are arranged in rows and columns from a top view of the semiconductor substrate 101.

In some embodiments, the semiconductor substrate 101 includes a trench 101f extending into the semiconductor substrate 101 and disposed in the peripheral region 101a. In some embodiments, the trench 101f extends from the first surface 101c toward the second surface 101d of the semiconductor substrate 101. In some embodiments, the trench 101f is tapered from the first surface 101c toward the second surface 101d of the semiconductor substrate 101. In some embodiments, a width of the trench 101f is substantially greater than a width of the first recess 101e.

In some embodiments, a first dielectric layer 102 is disposed conformal to the trench 101f. In some embodiments, the first dielectric layer 102 entirely covers a sidewall of the trench 101f. In some embodiments, the first dielectric layer 102 includes nitride.

In some embodiments, the memory device 100 includes an isolation structure 103 disposed within the trench 101f. In some embodiments, the isolation structure 103 is surrounded by the semiconductor substrate 101 and disposed in the peripheral region 101a. In some embodiments, the isolation structure 103 is a trench isolation structure extending into the semiconductor substrate 101 from the first surface 101c toward the second surface 101d of the semiconductor substrate 101. In some embodiments, the isolation structure 103 is a shallow trench isolation (STI). In some embodiments, the isolation structure 103 defines a boundary of the active area. In some embodiments, the isolation structure 103 is formed of an insulating material, such as silicon oxide, silicon nitride, silicon oxynitride, the like, or a combination thereof.

In some embodiments, the memory device 100 includes a word line 104 disposed within the first recess 101e. In some embodiments, the word line 104 includes an insulating layer 104a and a conductive member 104b surrounded by the insulating layer 104a. The insulating layer 104a is disposed conformal to the first recess 101e. In some embodiments, the insulating layer 104a entirely covers a sidewall of the first recess 101e. In some embodiments, the insulating layer 104a extends from the first surface 101c toward the second surface 101d of the semiconductor substrate 101.

In some embodiments, the insulating layer 104a includes dielectric material such as oxide. In some embodiments, the insulating layer 104a is formed of an insulating material, such as silicon oxide, silicon nitride, silicon oxynitride, the like, or a combination thereof. In some embodiments, the insulating layer 104a and the isolation structure 103 include a same material.

In some embodiments, the conductive member 104b is disposed within the first recess 101e and surrounded by the insulating layer 104a. In some embodiments, the conductive member 104b partially protrudes from the first surface 101c of the semiconductor substrate 101. A portion of the conductive member 104b is not surrounded by the insulating layer 104a. In some embodiments, a top surface 104d of the conductive member 104b is disposed above a top surface 104e of the insulating layer 104a. In some embodiments, the conductive member 104b includes conductive material such as titanium nitride (TiN). In some embodiments, an electrical resistance of the conductive member 104b is substantially less than an electrical resistance of tungsten (W).

In some embodiments, the conductive member 104b includes a second recess 104c extending into the conductive member 104b and toward the semiconductor substrate 101. In some embodiments, the second recess 104c extends from the first surface 101c toward the second surface 101d of the semiconductor substrate 101. In some embodiments, the insulating layer 104a surrounds the second recess 104c. In some embodiments, the second recess 104c is tapered from the first surface 101c toward the second surface 101d of the semiconductor substrate 101. In some embodiments, a first width W1 of the first recess 101e is substantially greater than a second width W2 of the second recess 104c. In some embodiments, a depth of the first recess 101e is substantially greater than a depth of the second recess 104c. In some embodiments, the depth of the second recess 104c is between about 100 nm and about 150 nm. In some embodiments, the depth of the second recess 104c is about 120 nm.

In some embodiments, the conductive member 104b includes a lining portion 104f and a plug portion 104g below the lining portion 104f. In some embodiments, the lining portion 104f is conformal to the insulating layer 104a. In some embodiments, the lining portion 104f at least partially protrudes from the first surface 101c of the semiconductor substrate 101 and the insulating layer 104a. In some embodiments, the plug portion 104g extends from the lining portion 104f toward the semiconductor substrate 101. The plug portion 104g is entirely surrounded by the insulating layer 104a. In some embodiments, the second recess 104c is disposed above the plug portion 104g. In some embodiments, the plug portion 104g is tapered from the lining portion 104f toward the semiconductor substrate 101.

In some embodiments, the lining portion 104f and the plug portion 104g are integrally formed. In some embodiments, the lining portion 104f and the plug portion 104g include a same material. In some embodiments, the lining portion 104f and the plug portion 104g include titanium nitride (TiN).

In some embodiments, the memory device 100 includes a second dielectric layer 105 disposed over the semiconductor substrate 101, the isolation structure 103 and the insulating layer 104a. In some embodiments, the second dielectric layer 105 covers the first surface 101c of the semiconductor substrate 101. In some embodiments, the top surface 104e of the insulating layer 104a is covered by the second dielectric layer 105. In some embodiments, the top surface 104d of the conductive member 104b is exposed through the second dielectric layer 105.

In some embodiments, a top surface 105a of the second dielectric layer 105 is substantially coplanar with the top surface 104d of the conductive member 104b. In some embodiments, the second dielectric layer 105 covers the isolation structure 103. In some embodiments, the second dielectric layer 105 is disposed over and in contact with the first dielectric layer 102. In some embodiments, the second dielectric layer 105 is disposed in both the peripheral region 101a and the array region 101b.

In some embodiments, the second dielectric layer 105 surrounds a protruding portion of the lining portion 104f. In some embodiments, the lining portion 104f is surrounded by the insulating layer 104a and the second dielectric layer 105. The second dielectric layer 105 is separated from the plug portion 104g, and is in contact with the lining portion 104f. In some embodiments, the first dielectric layer 102 and the second dielectric layer 105 include same or different materials. In some embodiments, the second dielectric layer 105 includes nitride.

Figure 3:
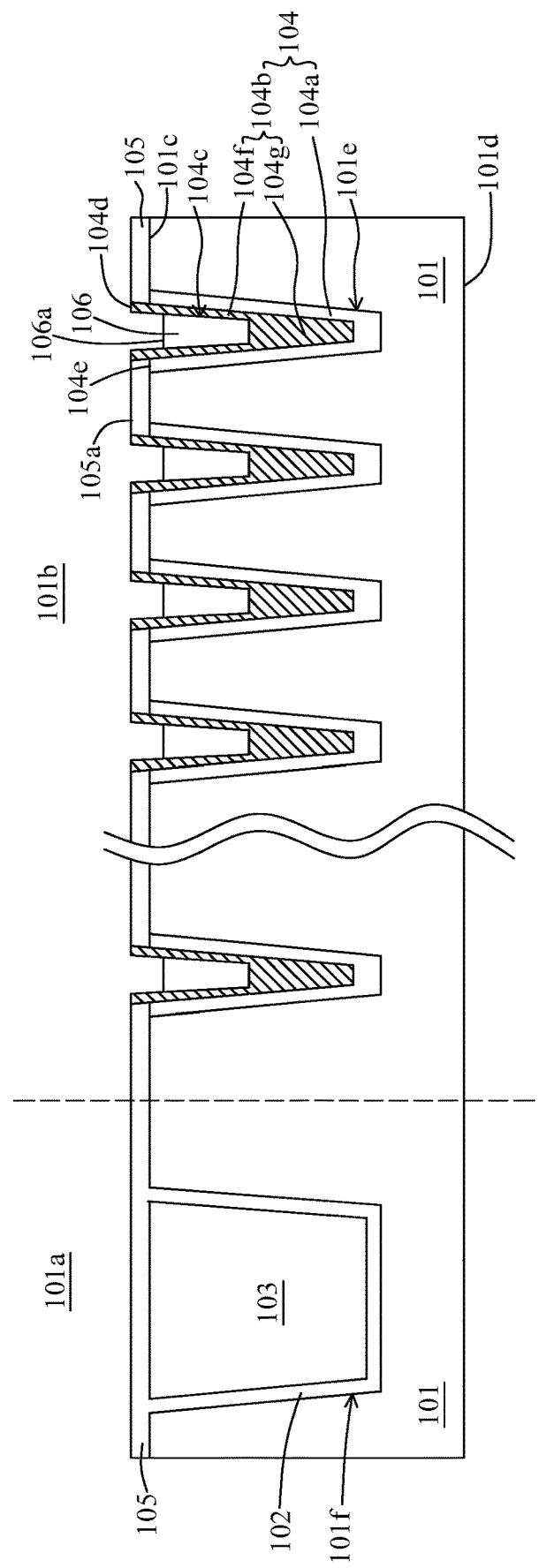
FIG. 3 is another embodiment of a cross-sectional side view of the memory device along the line A-A' in FIG. 1.

In some embodiments, as shown in FIG. 3, the memory device 100 further includes a work function member 106 filling at least a portion of the second recess 104c. In some embodiments, the work function member 106 is surrounded by the lining portion 104f and disposed above the plug portion 104g. In some embodiments, a top surface 106a of the work function member 106 is disposed below the first surface 101c of the semiconductor substrate 101, the top surface 104e of the insulating layer 104 and the top surface 104d of the conductive member 104b. In some embodiments, the work function member 106 includes polysilicon or polycrystalline silicon. In some embodiments, the work function member 106 has dual work functions and includes metal and polysilicon. In some embodiments, the work function member 106 serves as a gate electrode.

Figure 4:
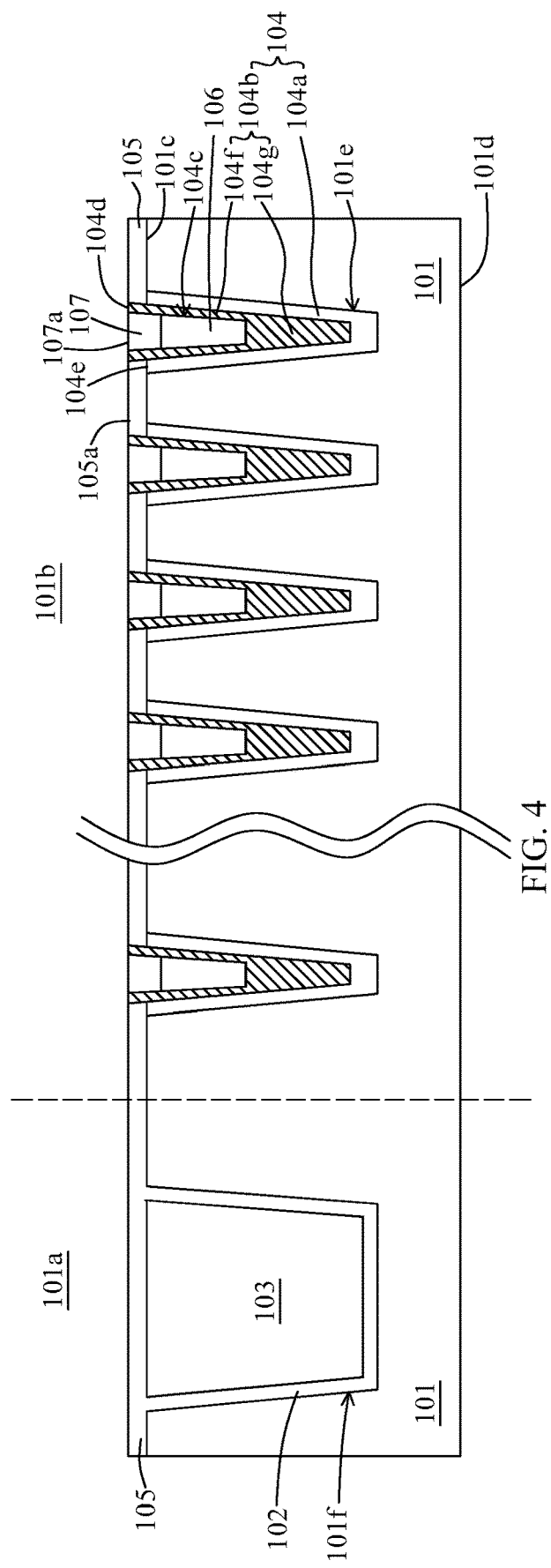
FIG. 4 is another embodiment of a cross-sectional side view of the memory device along the line A-A' in FIG. 1.

In some embodiments, as shown in FIG. 4, the memory device further includes a gate insulating member 107 disposed over the work function member 106. In some embodiments, a top surface 107a of the gate insulating member 107 is substantially coplanar with the top surface 105a of the second dielectric layer 105. In some embodiments, the gate insulating member 107 includes dielectric material such as oxide, nitride or the like.

Figure 5:
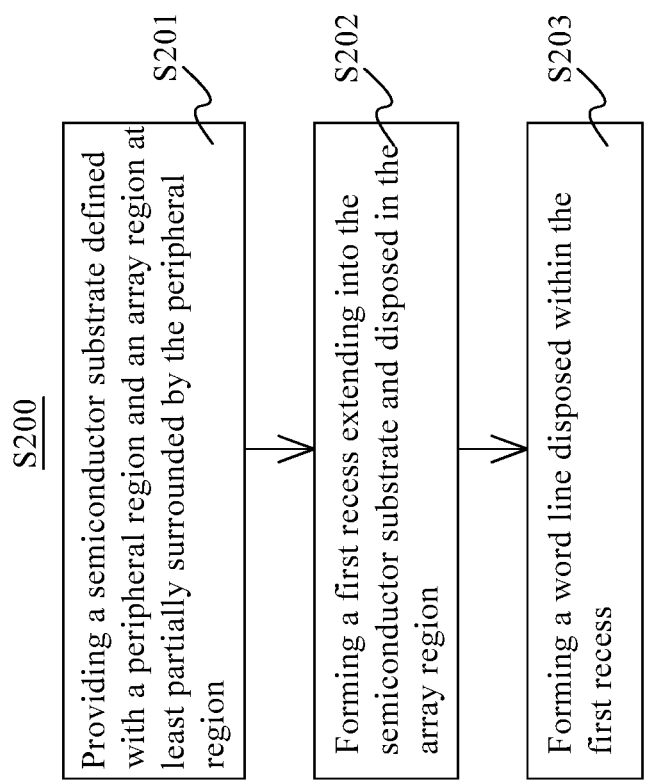
FIG. 5 is a flow diagram illustrating a method of manufacturing a memory device in accordance with some embodiments of the present disclosure.

FIG. 5 is a flow diagram illustrating a method S200 of manufacturing a memory device 100 in accordance with some embodiments of the present disclosure, and FIGS. 6 to 20 illustrate cross-sectional views of intermediate stages in formation of the memory device 100 in accordance with some embodiments of the present disclosure.

The stages shown in FIGS. 6 to 20 are also illustrated schematically in the flow diagram in FIG. 5. In following discussion, the fabrication stages shown in FIGS. 6 to 20 are discussed in reference to process steps shown in FIG. 5. The method S200 includes a number of operations, and description and illustration are not deemed as a limitation to a sequence of the operations. The method S200 includes a number of steps (S201, S202 and S203).

Figure 6:
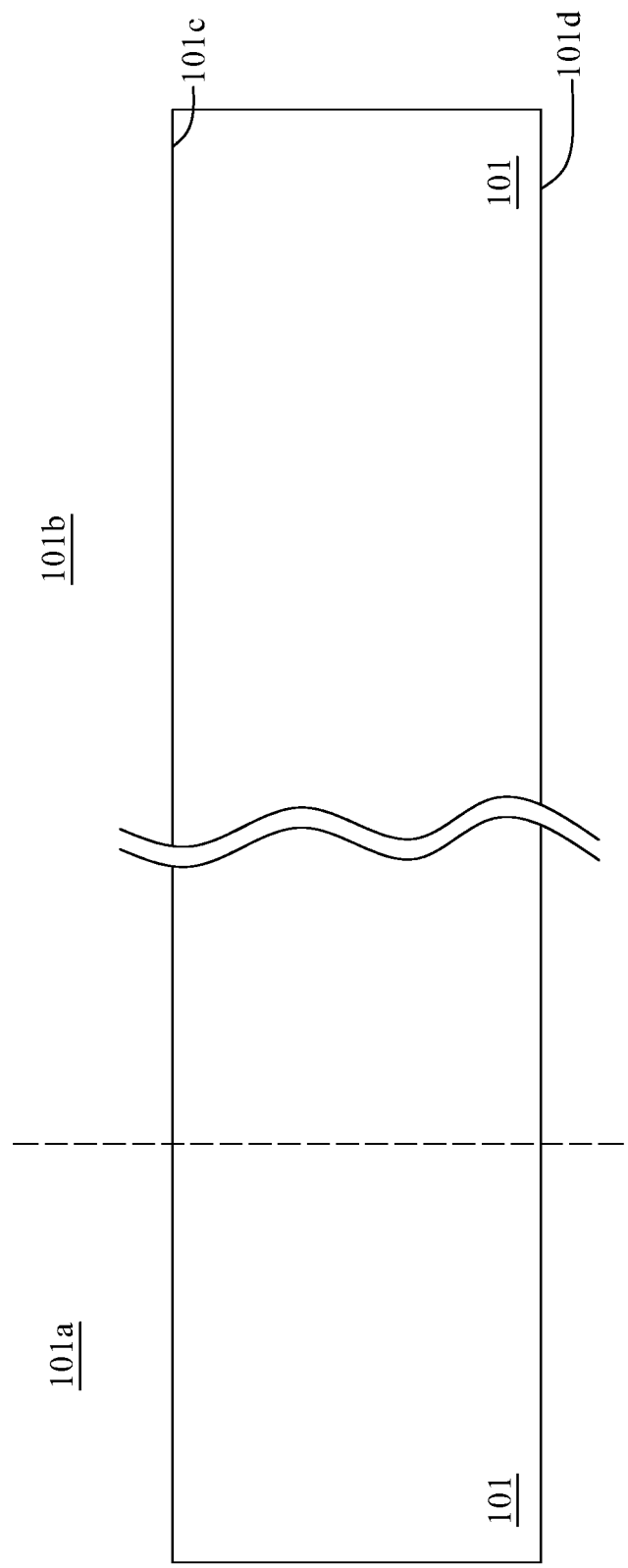
FIGS. 6 to 20 illustrate cross-sectional views of intermediate stages in the formation of a memory device in accordance with some embodiments of the present disclosure.

Referring to FIG. 6, a semiconductor substrate 101 is provided according to step S201 in FIG. 5. In some embodiments, the semiconductor substrate 101 is semiconductive. In some embodiments, the semiconductor substrate 101 is a silicon substrate. In some embodiments, the semiconductor substrate 101 is defined with a peripheral region 101a and an array region 101b at least partially surrounded by the peripheral region 101a. In some embodiments, the semiconductor substrate 101 includes a first surface 101c and a second surface 101d opposite to the first surface 101c.

Figure 7:
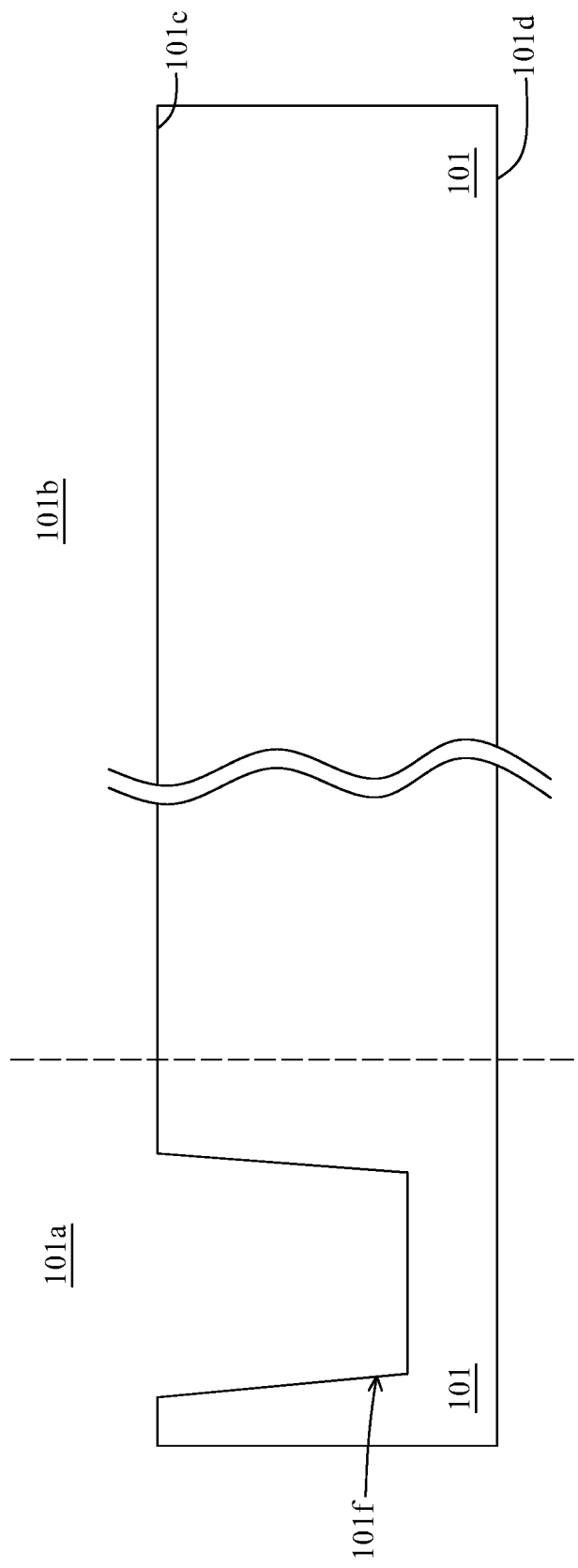

Referring to FIG. 7, a trench 101f is formed after step S201. In some embodiments, the trench 101f is formed by removing a portion of the semiconductor substrate 101 by a process such as etching or any other suitable process. In some embodiments, the removal is performed from the first surface 101c toward the second surface 101d of the semiconductor substrate 101, such that the trench 101f extending from the first surface 101c toward the second surface 101d is formed. In some embodiments, the removal is performed in the peripheral region 101a, so that the trench 101f is formed in the peripheral region 101a.

Figure 8:
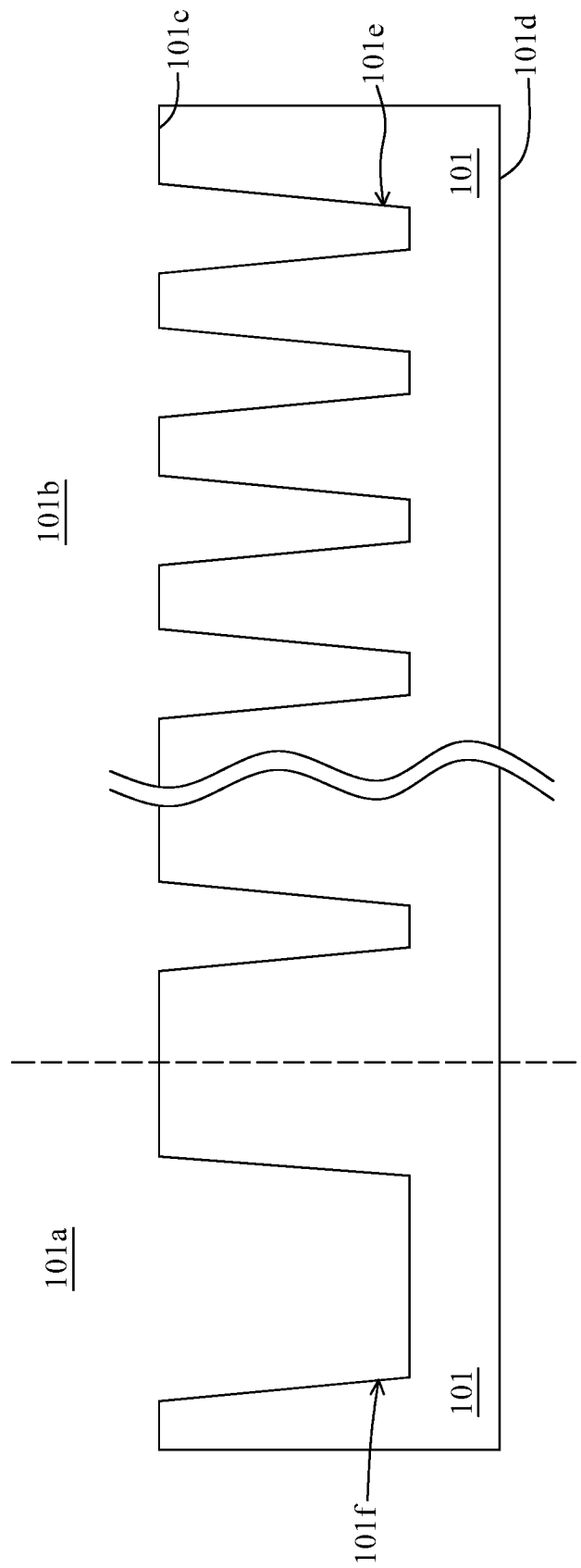

Referring to FIG. 8, a first recess 101e is formed according to step S202 in FIG. 5. The first recess 101e extends into the semiconductor substrate 101 and is disposed in the array region 101b. In some embodiments, the first recess 101e is formed by removing a portion of the semiconductor substrate 101 by a process such as etching or any other suitable process. In some embodiments, the removal is performed from the first surface 101c toward the second surface 101d of the semiconductor substrate 101, such that the first recess 101e extending from the first surface 101c toward the second surface 101d is formed.

In some embodiments, the removal is performed in the array region 101b, so that the first recess 101e is formed in the array region 101b. In some embodiments, several first recesses 101e are formed in the array region 101b separately or simultaneously. In some embodiments, the formation of the trench 101f and the formation of the first recess 101e are performed separately or simultaneously.

Figure 9:
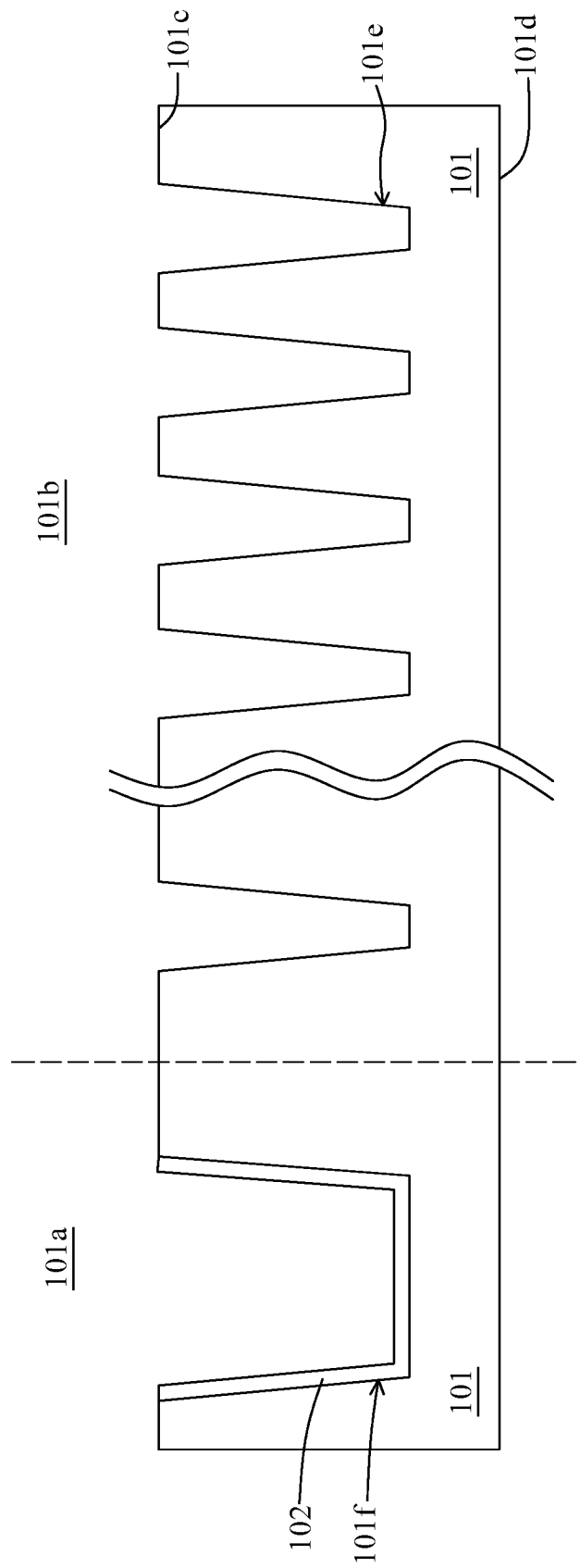

Referring to FIG. 9, a first dielectric layer 102 is disposed conformal to the trench 101f after the formation of the trench 101f. In some embodiments, the first dielectric layer 102 is formed by deposition such as chemical vapor deposition (CVD) or any other suitable process. The first dielectric layer 102 entirely covers a sidewall of the trench 101f. In some embodiments, the formation of the first dielectric layer 102 is performed before or after the formation of the first recess 101e. In some embodiments, the first dielectric layer 102 includes nitride or the like.

Figure 10:
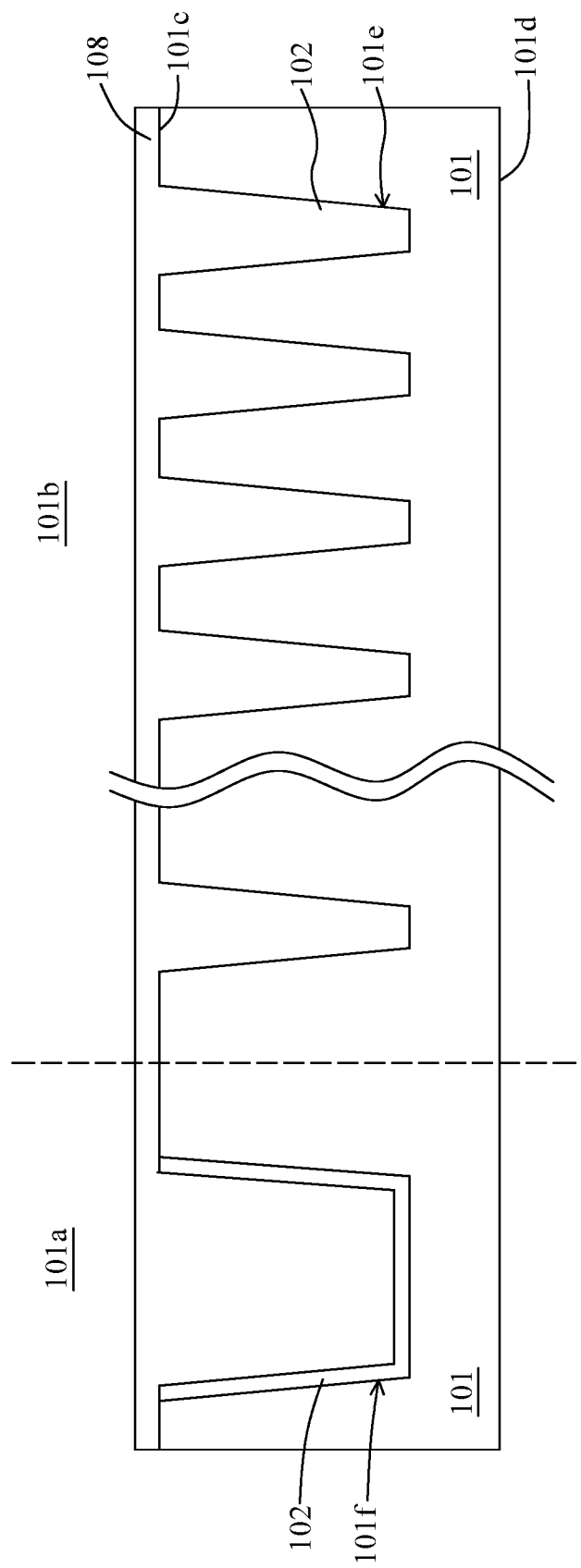

Referring to FIG. 10, after the formation of the trench 101f and the formation of the first recess 101e, a dielectric material 108 is disposed over the first surface 101c of the semiconductor substrate 101 and conformal to the first recess 101e and the first dielectric layer 102. In some embodiments, the dielectric material 108 fills the first recess 101e and covers the first surface 101c and the first dielectric layer 102. In some embodiments, the dielectric material 108 is disposed by CVD or any other suitable process. In some embodiments, the dielectric material 108 includes oxide.

Figure 11:
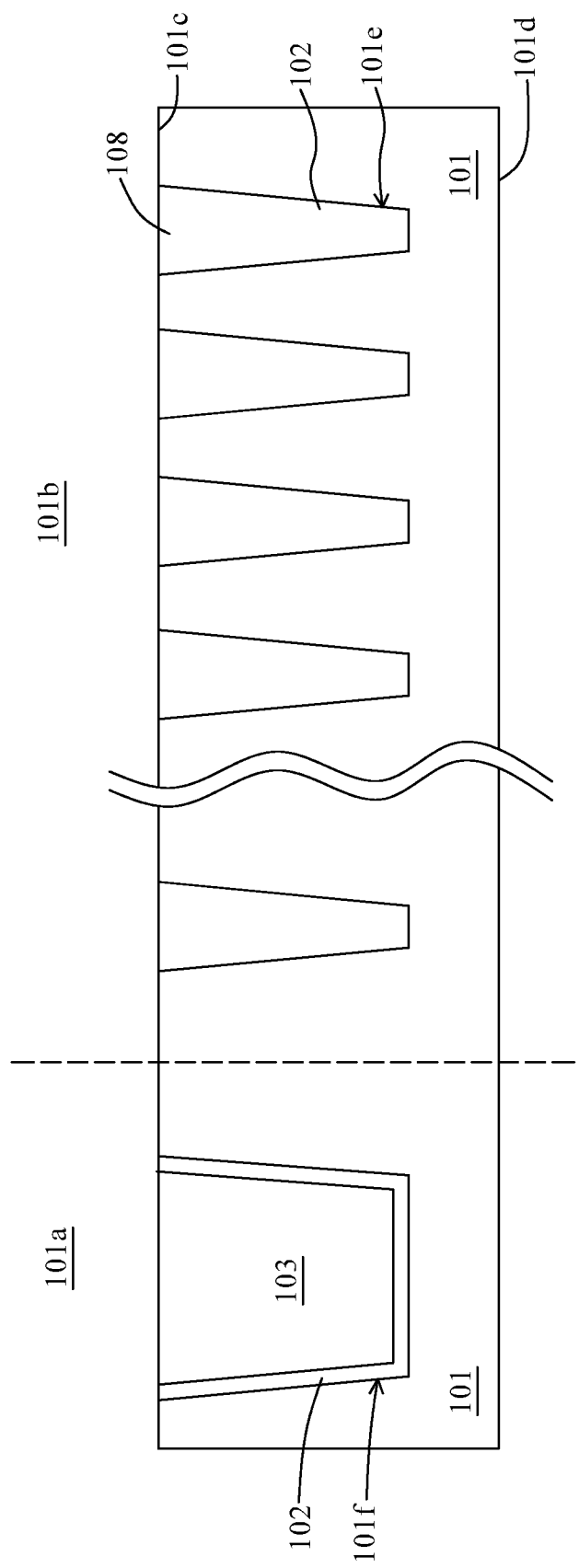

Referring to FIG. 11, after the disposing of the dielectric material 108, some portions of the dielectric material 108 on the first surface 101c and protruding out of the first recess 101e and the trench 102f are removed by planarization, etching or any other suitable process. In some embodiments, an isolation structure 103 is formed after the removal. The isolation structure 103 is surrounded by the trench 102*f* and the first dielectric layer 102. In some embodiments, the isolation structure 103 is a shallow trench isolation (STI).

Figure 12:
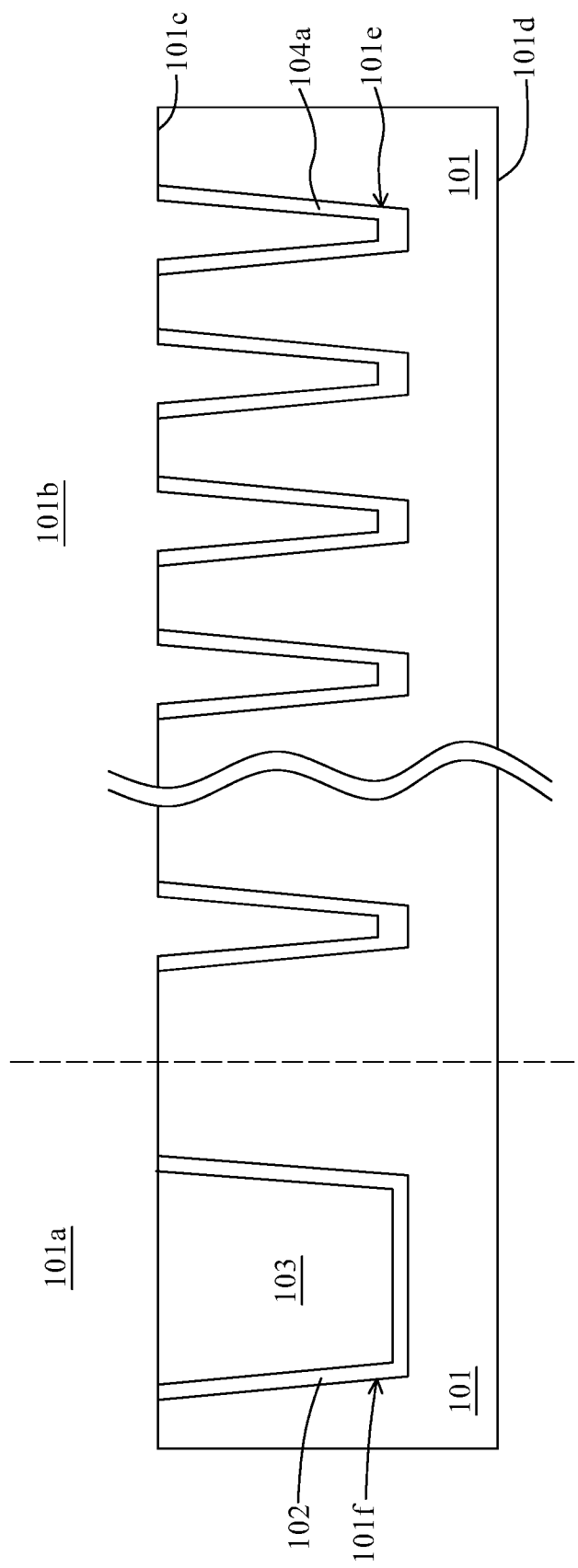

Referring to FIGS. 12, 13, 14 and 15, a word line 104 is formed according to step S203 in FIG. 5. In some embodiments, the word line 104 is disposed within the first recess 101*e*. In some embodiments, as shown in FIG. 12, a portion of the dielectric material 108 disposed within the first recess 101*e* is removed by etching or any other suitable process to form an insulating layer 104*a* of the word line 104. In some embodiments, the insulating layer 104*a* is conformal to the first recess 101*e*. The insulating layer 104*a* entirely covers a sidewall of the first recess 101*e*. In some embodiments, the insulating layer 104*a* includes oxide or the like.

Figure 13:
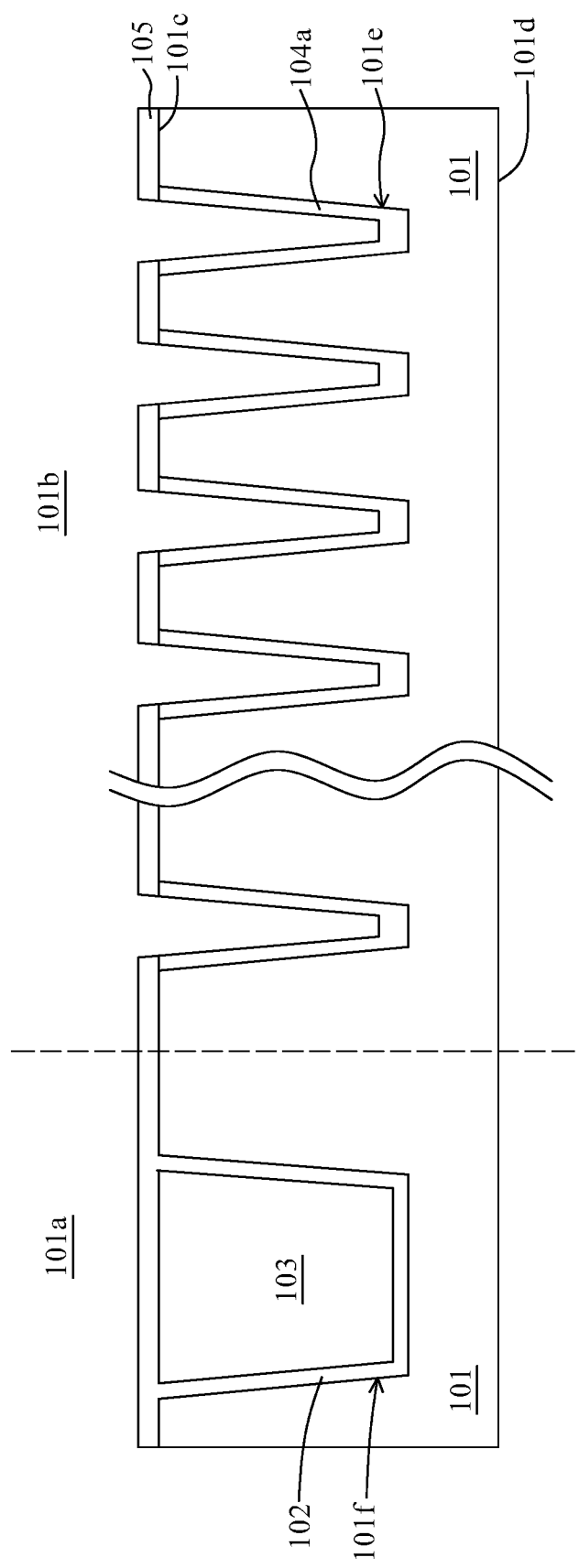

Referring to FIG. 13, after the formation of the insulating layer 104*a*, a second dielectric layer 105 is disposed over the first surface 101*c* of the semiconductor substrate 101, the isolation structure 103, the first dielectric layer 102 and the insulating layer 104*a*. In some embodiments, the second dielectric layer 105 is formed by deposition such as CVD or any other suitable process.

In some embodiments, the formation of the second dielectric layer 105 is performed after the formation of the insulating layer 104*a* and the isolation structure 103. In some embodiments, the second dielectric layer 105 includes nitride or the like. In some embodiments, the first dielectric layer 102 and the second dielectric layer 105 includes same or different materials. In some embodiments, an interface between the first dielectric layer 102 and the second dielectric layer 105 is absent.

Figure 14:
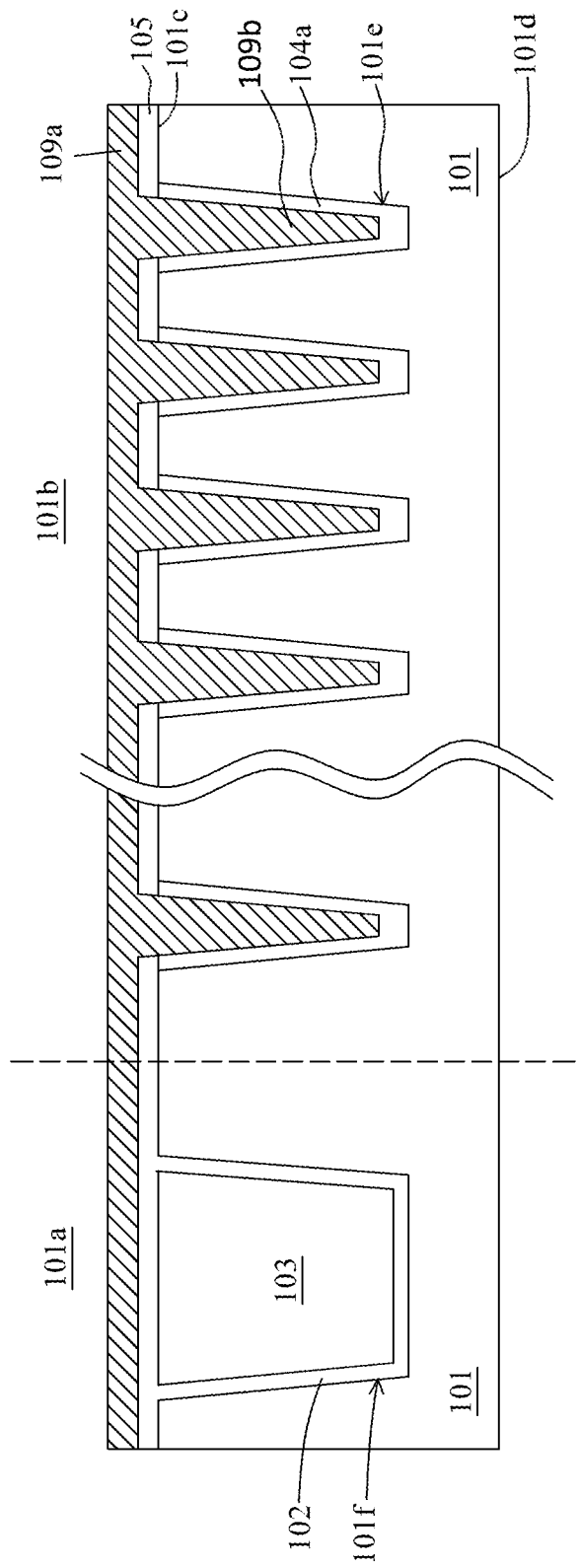
Figure 15:
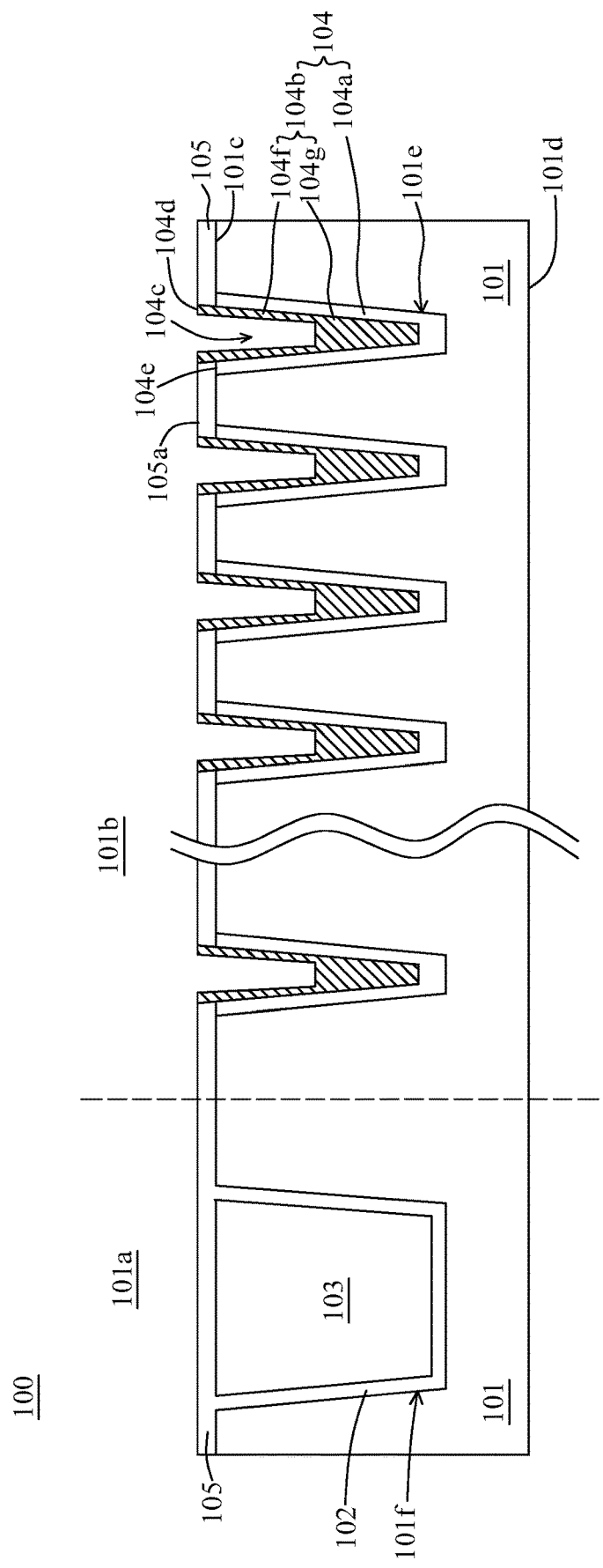

Referring to FIGS. 14 and 15, a conductive member 104*b* is formed. In some embodiments, the formation of the conductive member 104*b* includes disposing a conductive material 109 covering the insulating layer 104*a* as shown in FIG. 14. In some embodiments, the conductive material 109 is disposed over the second dielectric layer 105 and surrounded by the first recess 101*e* and the insulating layer 104*a*. The conductive material 109 covers the insulating layer 104*a* and the first surface 101*c* of the semiconductor substrate 101. In some embodiments, the conductive material 109 is disposed on the second dielectric layer 105 and the insulating layer 104*a*. In some embodiments, the conductive material 109 is disposed by deposition or any other suitable process.

In some embodiments, a second recess 104*c* is formed as shown in FIG. 15 after the disposing of the conductive material 109. In some embodiments, the second recess 104*c* is formed by removing a first portion 109*a* of the conductive material 109 disposed over the semiconductor substrate 101 and a second portion 109*b* of the conductive material 109 surrounded by the insulating layer 104*a*. In some embodiments, the removal of the first portion 109*a* of the conductive material 109 disposed over the semiconductor substrate 101 and the removal of the second portion 109*b* of the conductive material 109 surrounded by the insulating layer 104*a* are performed separately or simultaneously. In some embodiments, the removal of the first portion 109*a* of the conductive material 109 disposed over the semiconductor substrate 101 and the removal of the second portion 109*b* of the conductive material 109 surrounded by the insulating layer 104*a* are performed continuously or sequentially.

In some embodiments, the removal of the first and second portions 109*a* and 109*b* of the conductive material 109 further comprises heating the semiconductor substrate to a predetermined temperature, and applying a step pulsing function for the removal of the first and second portions 109*a* and 109*b* of the conductive material 109 in a predetermined duty cycle. In some embodiments, the predetermined temperature is in a range of about 95° C. to about 140° C. In some embodiments, the predetermined temperature is substantially greater than 120° C. In some embodiments, the predetermined duty cycle is in a range of about 15% to about 25%. In some embodiments, a volatile by-product such as titanium chloride ($TiCl_3$, $TiCl_4$ or the like) is produced during the removal of the first and second portions 109*a* and 109*b* of the conductive material 109, and the volatile by-product can be easily removed by the heating of the semiconductor substrate to the predetermined temperature or the application of the step pulsing function.

In some embodiments, the removal of the first and second portions 109*a* and 109*b* of the conductive material 109 is performed in-situ to save processing time and reduce possibility of contamination. As used herein, the term "in-situ" is used to refer to processes in which the semiconductor substrate 101 being processed is not exposed to an external ambient (e.g., external to the processing system) environment. The conductive member 104*b* is formed after the formation of the second recess 104*c*. In some embodiments, the second recess 104*c* extends into the conductive member 104*b* and toward the second surface 101*d* of the semiconductor substrate 101.

Figure 16:
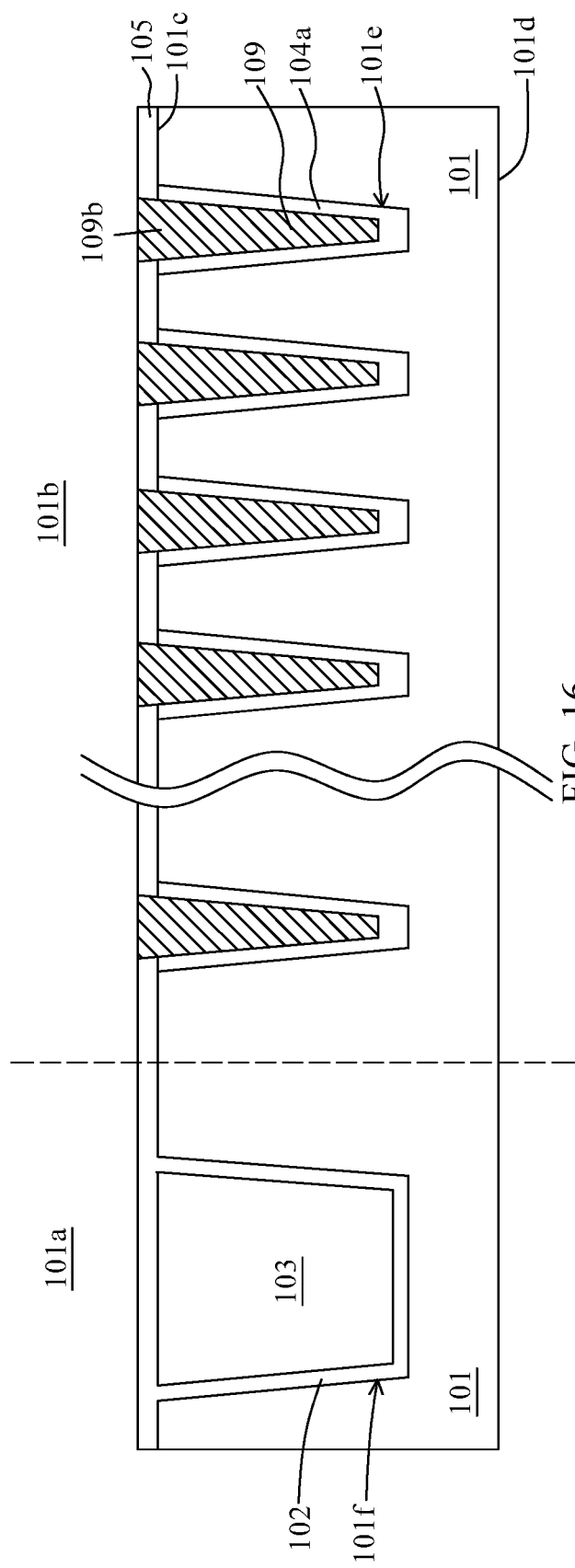
Figure 17:
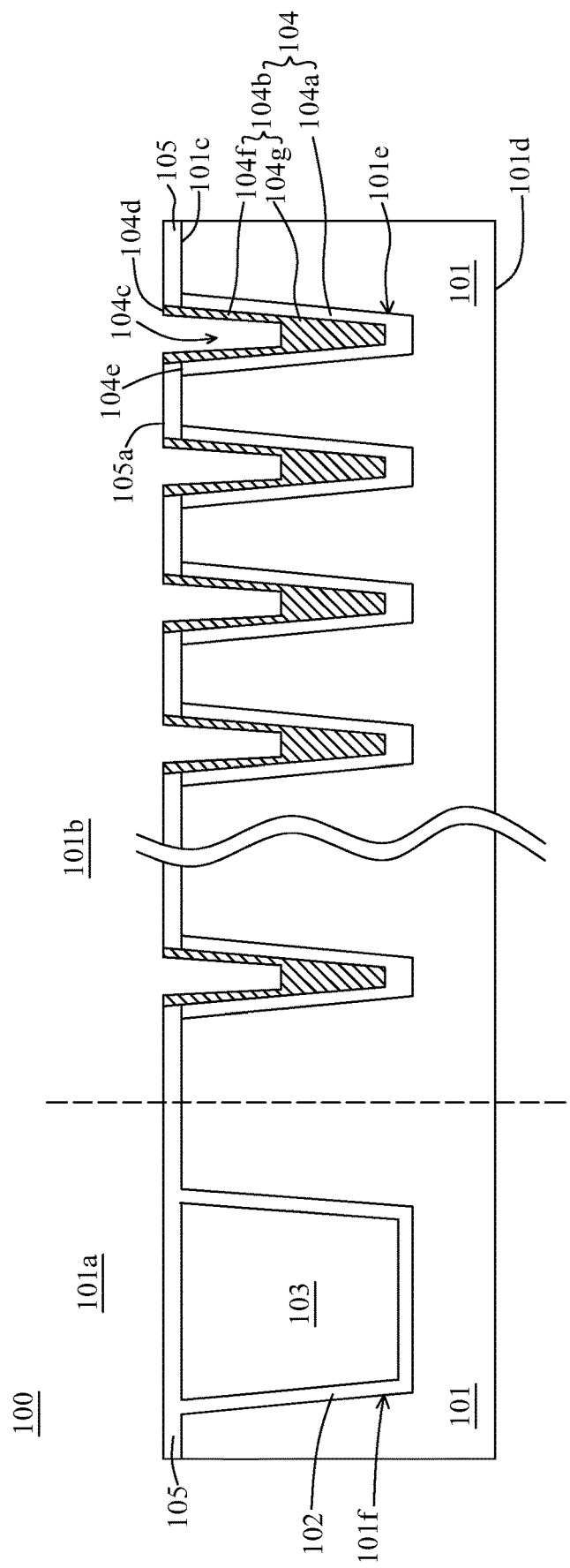

In some embodiments as shown in FIGS. 16 to 17, the removal of the first portion 109*a* of the conductive material 109 disposed over the semiconductor substrate 101 and the removal of the second portion 109*b* of the conductive material 109 surrounded by the insulating layer 104*a* are performed separately and sequentially. The first portion 109*a* of the conductive material 109 disposed over the semiconductor substrate 101 is removed as shown in FIG. 16, and then the second portion 109*b* of the conductive material 109 surrounded by the insulating layer 104*a* is removed to form the second recess 104*c* as shown in FIG. 17. In some embodiments, the removal of the first portion 109*a* of the conductive material 109 is performed immediately prior to the removal of the second portion 109*b* of the conductive material 109. In some embodiments, the second recess 104*c* is formed by the removal of the second portion 109*b* of the conductive material 109.

In some embodiments as shown in FIGS. 15 and 17, after the formation of the conductive member 104*b*, neither the conductive material 109 nor the conductive member 104*b* is disposed over the top surface 105*a* of the second dielectric layer 105. In some embodiments, a memory device 100 is formed as shown in FIGS. 15 and 17.

Figure 18:
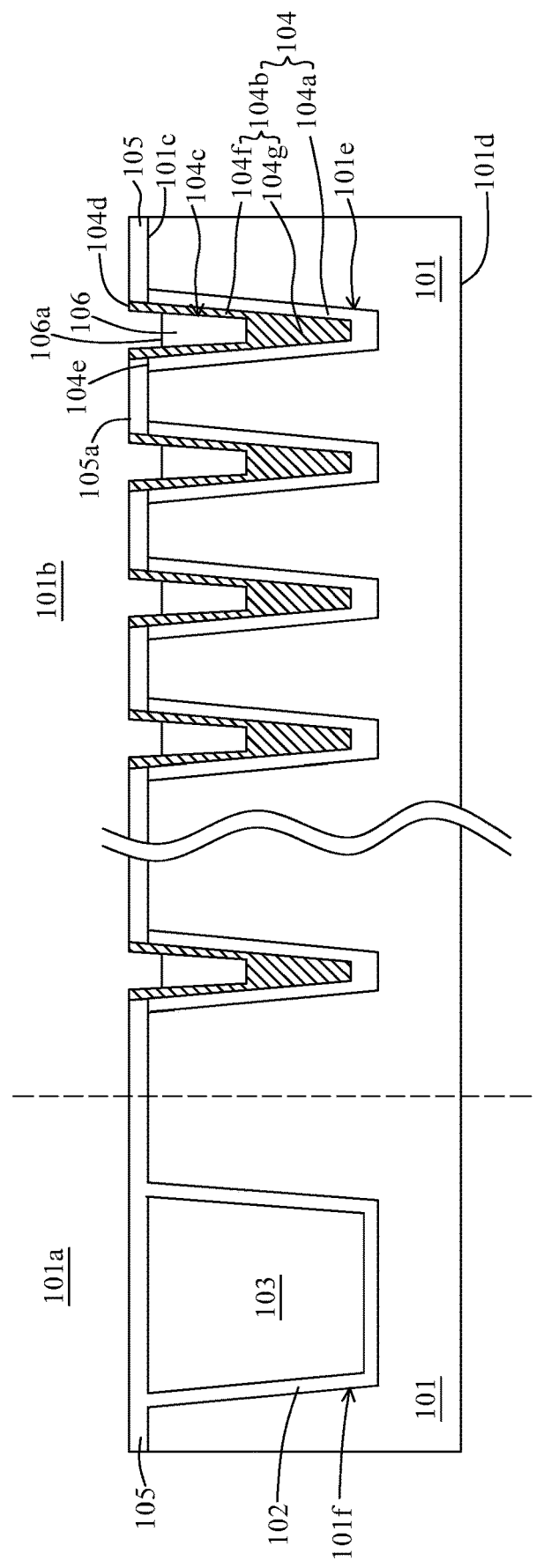

In some embodiments as shown in FIG. 18, a work function member 106 is formed. In some embodiments, the work function member 106 is surrounded by the conductive member 104*b*. The work function member 106 is disposed over the plug portion 104*g* and surrounded by the lining portion 104*f* of the conductive member 104. In some embodiments, the work function member 106 fills at least a portion of the second recess 104*c*. In some embodiments, the work function member 106 is formed by CVD or any other suitable process.

Figure 19:
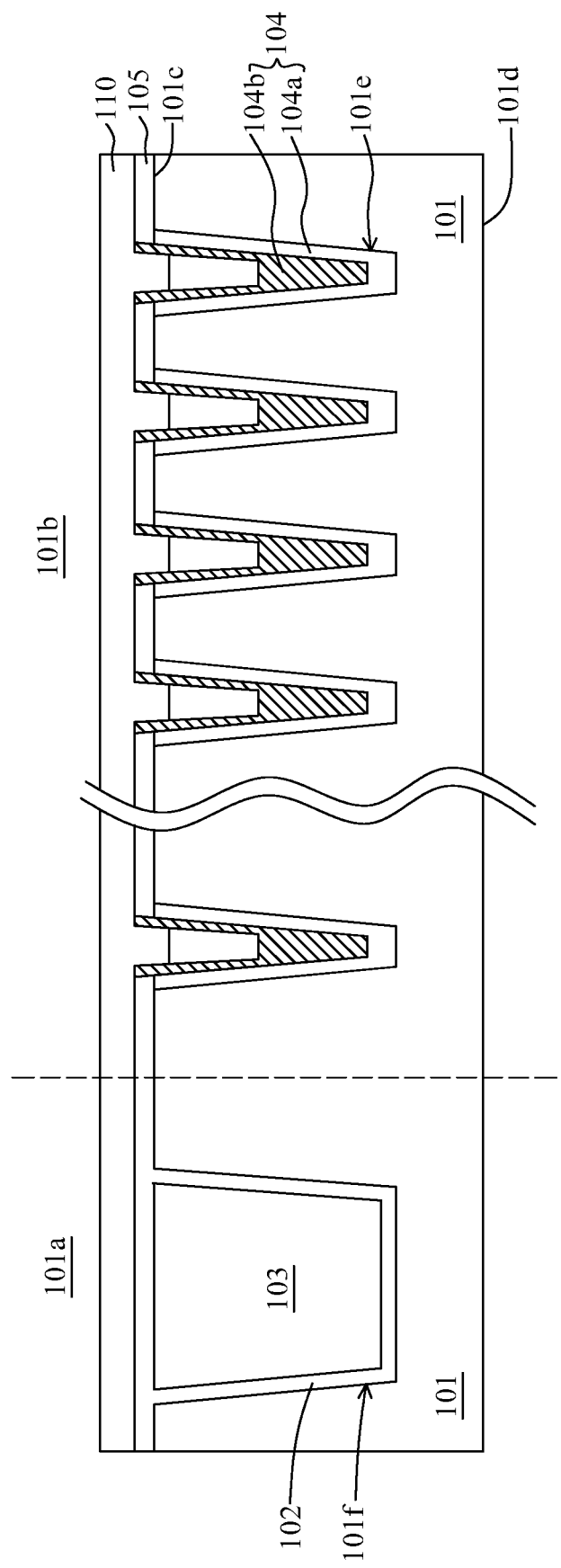
Figure 20:
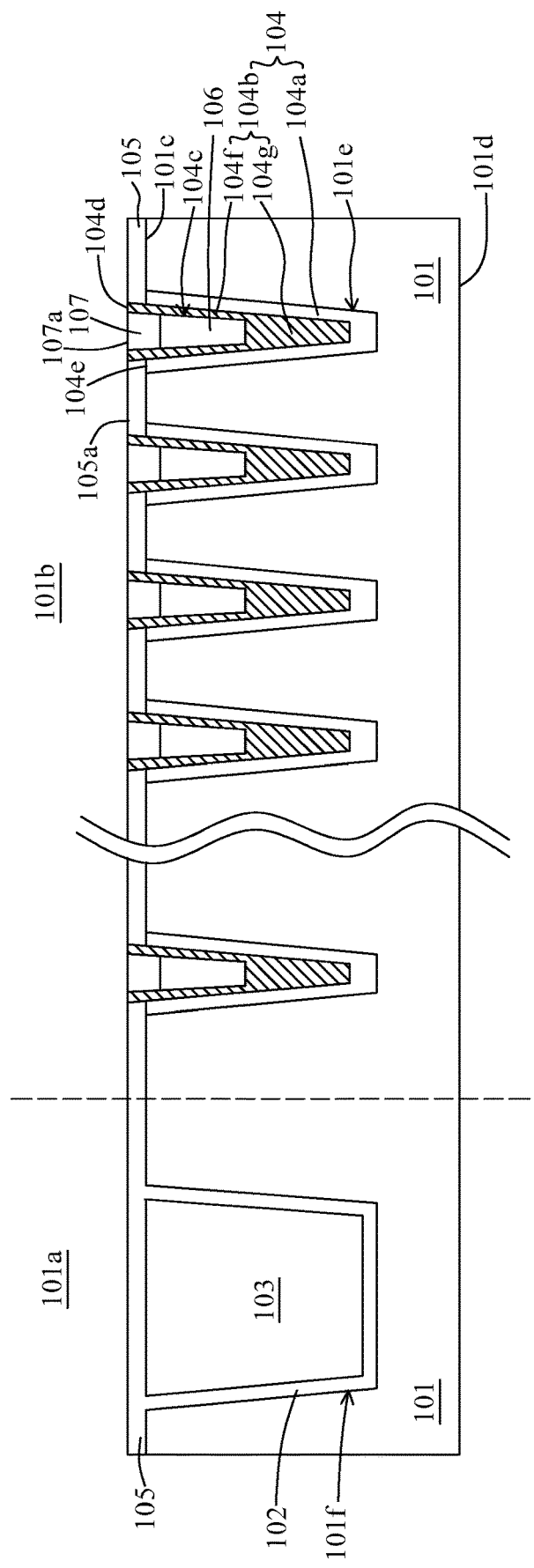

In some embodiments as shown in FIGS. 19 to 20, a gate insulating member 107 is formed. In some embodiments, the gate insulating member 107 is disposed over the work function member 106 and surrounded by the lining portion 104*f* of the conductive member 104. In some embodiments, the gate insulating member 107 fills at least a portion of the second recess 104*c*, such that a top surface 107*a* of the gate insulating member 107 is substantially coplanar with the top surface 105*a* of the second dielectric layer 105.

In some embodiments, the gate insulating member 107 is formed by disposing an insulating material 110 over the second dielectric layer 105 and filling at least a portion of the second recess 104c as shown in FIG. 19, and then removing some portions of the insulating material 110 as shown in FIG. 20 until the top surface 105a of the second dielectric layer 105 is exposed. In some embodiments, the insulating material 110 is disposed by CVD or any other suitable process. In some embodiments, some portions of the insulating material 110 are removed by planarization, etching or any other suitable process.

In an aspect of the present disclosure, a memory device is provided. The memory device includes a semiconductor substrate defined with a peripheral region and an array region at least partially surrounded by the peripheral region, and further includes a first recess extending into the semiconductor substrate and disposed in the array region; an isolation structure surrounded by the semiconductor substrate and disposed in the peripheral region; and a word line disposed within the first recess, wherein the word line includes an insulating layer conformal to the first recess and a conductive member surrounded by the insulating layer, and the conductive member includes a second recess extending into the conductive member and toward the semiconductor substrate.

In another aspect of the present disclosure, a memory device is provided. The memory device includes a semiconductor substrate defined with a peripheral region and an array region at least partially surrounded by the peripheral region; an isolation structure surrounded by the semiconductor substrate and disposed in the peripheral region; and a word line surrounded by the semiconductor substrate and disposed in the array region, wherein the word line includes an insulating layer and a conductive member surrounded by the insulating layer, the conductive member includes a lining portion conformal to the insulating layer and a plug portion extending from the lining portion toward the semiconductor substrate, and the lining portion and the plug portion are integrally formed.

In another aspect of the present disclosure, a method of manufacturing a memory device is provided. The method includes steps of providing a semiconductor substrate defined with a peripheral region and an array region at least partially surrounded by the peripheral region; forming a first recess extending into the semiconductor substrate and disposed in the array region; and forming a word line disposed within the first recess, wherein the formation of the word line includes disposing an insulating layer conformal to the first recess, and forming a conductive member surrounded by the insulating layer and having a second recess extending into the conductive member and toward the semiconductor substrate.

In conclusion, because titanium nitride (TiN) instead of tungsten (W) is used for a conductive member of the word line of the memory device, an electrical resistance of the word line using titanium nitride (TiN) is reduced. Further, since the conductive member is formed by disposing titanium nitride (TiN) over the semiconductor substrate and within a recess of the word line and etching back a portion of titanium nitride (TiN) inside the recess, planarization of a portion of titanium nitride (TiN) disposed over the semiconductor substrate and cleaning after the planarization can be omitted. Therefore, performance of the memory device and process of manufacturing of the memory device are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:
   providing a semiconductor substrate defined with a peripheral region and an array region at least partially surrounded by the peripheral region;
   forming a first recess extending into the semiconductor substrate from a top surface thereof and disposed in the array region;
   forming a word line disposed within the first recess, wherein the word line has a protruding portion protruded out of the top surface of the semiconductor substrate; and
   forming a dielectric layer on the top surface of the semiconductor substrate, wherein the protruding portion of the word line is surrounded by the dielectric layer;
   wherein the formation of the word line includes disposing an insulating layer conformal to the first recess at a position that a top surface of the insulating layer is coplanar with the top surface of the semiconductor substrate, and forming a conductive member surrounded by the insulating layer and having a second recess extending into the conductive member and toward the semiconductor substrate, wherein the protruding portion of the word line is defined at an upper portion of the conductive member;
   wherein the conductive member has a bottom end disposed at a bottom portion of the first recess and a top surface which is extended above the top surface of the semiconductor substrate and is coplanar with a top surface of the dielectric layer.

2. The method according to claim 1, wherein the formation of the conductive member comprises disposing a conductive material covering the insulating layer within the first recess and covering the top surface of the semiconductor substrate, and removing an upper portion of the conductive material disposed over the semiconductor substrate and surrounded by the insulating layer, such that a remaining portion of the conductive material forms the conductive member, wherein the conductive member has a plug portion at the bottom portion of the first recess and a lining portion extended from the plug portion and above the top surface of the semiconductor substrate.

3. The method according to claim 2, wherein the removal of the conductive material comprises removing a first portion of the upper portion of the conductive material disposed over the semiconductor substrate, and removing a second portion of the upper portion of the conductive material surrounded by the insulating layer at an upper portion of the first recess.

4. The method according to claim 3, wherein the removal of the first portion of the conductive material is performed immediately prior to the removal of the second portion of the conductive material.

5. The method according to claim 3, wherein the second recess is formed by the removal of the second portion of the conductive material and is formed within the lining portion of the conductive member.

6. The method according to claim 3, during the removal of the first portion and the second portion of the conductive material, further comprising heating the semiconductor substrate to a predetermined temperature, and applying a step pulsing function for the removal of the first portion and the second portion of the conductive material in a predetermined duty cycle.

7. The method according to claim 6, wherein the predetermined temperature is in a range of about 95° C. to about 140° C.

8. The method according to claim 6, wherein the predetermined temperature is substantially greater than 120° C.

9. The method according to claim 6, wherein the predetermined duty cycle is in a range of about 15% to about 25%.

10. The method according to claim 2, further comprising disposing a dielectric material over the semiconductor substrate and the insulating layer, wherein the dielectric material forms the dielectric layer to cover on the top surface of the semiconductor substrate and a top surface of the insulating layer.

11. The method according to claim 10, wherein the dielectric material is disposed after the disposing of the insulating layer in order to cover the top surface of the insulating layer by the dielectric material.

12. The method according to claim 1, wherein the conductive member includes titanium nitride (TiN).

13. The method according to claim 1, wherein a first width of the first recess is substantially greater than a second width of the second recess.

14. A method of manufacturing a memory device, comprising:
providing a semiconductor substrate defined with a peripheral region and an array region at least partially surrounded by the peripheral region;
forming an isolation structure surrounded by the semiconductor substrate and disposed in the peripheral region;
forming a word line surrounded by the semiconductor substrate and disposed in the array region, and
forming a dielectric layer on a top surface of the semiconductor substrate;
wherein the word line comprises an insulating layer and a conductive member surrounded by the insulating layer, wherein the conductive member has a lining portion conformal to the insulating layer and a plug portion extending from the lining portion, wherein the lining portion and the plug portion are integrally formed;
wherein a top surface of the insulating layer is coplanar with the top surface of the semiconductor substrate;
wherein an upper portion of the lining portion of the word line is extended above the top surface of the semiconductor substrate and is surrounded by the dielectric layer, such that a top surface of the lining portion of the word line is extended above the top surface of the insulating layer;
wherein the top surface of the lining portion of the word line is coplanar with a top surface of the dielectric layer.

15. The method according to claim 14, wherein the lining portion and the plug portion are made of a same material, and the lining portion is formed above the plug portion.

16. The method according to claim 14, wherein the lining portion and the plug portion are made of titanium nitride (TiN), and the lining portion is at least partially protrudes from the semiconductor substrate and the insulating layer.

17. The method according to claim 14, wherein the plug portion is entirely surrounded by the insulating layer, and the plug portion is tapered from the lining portion toward the semiconductor substrate.

18. The method according to claim 14, further comprising: forming an additional dielectric layer, having a U-shaped cross section, downwardly extended from the dielectric layer, wherein the isolation structure is surrounded by the dielectric layer and the additional layer.

19. The method according to claim 18, wherein the dielectric layer includes nitride, and the dielectric layer is separated from the plug portion.

20. The method according to claim 18, wherein the dielectric layer includes nitride, and the dielectric layer is in contact with the lining portion.

* * * * *